United States Patent
Huang et al.

(10) Patent No.: US 11,013,156 B1
(45) Date of Patent: May 18, 2021

(54) EMI SHIELDING FILM AND METHOD OF MANUFACTURING THE SAME

(71) Applicant: NANOBIT TECH. CO., LTD., Taoyuan (TW)

(72) Inventors: Sung-Chien Huang, Taoyuan (TW); Yu-Yang Chang, Taoyuan (TW); Hsiou-Ming Liu, Taoyuan (TW); Ping-Feng Yu, Taoyuan (TW)

(73) Assignee: NANOBIT TECH. CO., LTD., Taoyuan (TW)

( * ) Notice: Subject to any disclaimer, the term of this patent is extended or adjusted under 35 U.S.C. 154(b) by 0 days.

(21) Appl. No.: 16/994,590

(22) Filed: Aug. 15, 2020

(30) Foreign Application Priority Data

Jul. 23, 2020 (TW) .................................. 109124908

(51) Int. Cl.
*H05K 9/00* (2006.01)
*C09J 9/02* (2006.01)
*C09J 7/29* (2018.01)

(52) U.S. Cl.
CPC .............. *H05K 9/0088* (2013.01); *C09J 7/29* (2018.01); *C09J 9/02* (2013.01); *C09J 2433/00* (2013.01)

(58) Field of Classification Search
CPC .................................................. H05K 9/0088
See application file for complete search history.

(56) References Cited

U.S. PATENT DOCUMENTS

| | | | | |
|---|---|---|---|---|
| 6,218,017 B1* | 4/2001 | Yamashita | ................ | B32B 9/00 428/424.2 |
| 2003/0232181 A1* | 12/2003 | Simpson | .................. | G02B 5/22 428/212 |
| 2009/0272560 A1* | 11/2009 | Tokunaga | ................ | H05K 3/22 174/126.1 |
| 2012/0325545 A1* | 12/2012 | Higashitani | .............. | H01B 1/02 174/268 |
| 2013/0299214 A1* | 11/2013 | Frey | ....................... | H05K 3/061 174/253 |
| 2014/0154469 A1* | 6/2014 | Kagawa | ............... | H05K 9/0088 428/155 |
| 2018/0163063 A1* | 6/2018 | Gao | ..................... | H05K 9/0083 |

* cited by examiner

*Primary Examiner* — Hung V Ngo
(74) *Attorney, Agent, or Firm* — Chun-Ming Shih; HDLS IPR Services

(57) ABSTRACT

An EMI shielding film includes a flexible composite metal layer, a transparent insulating layer, and a conductive adhesive layer. The conductive adhesive layer is formed by removing a solvent from a conductive adhesive composition. The conductive adhesive composition includes an acrylate solution, a divalent acid ester solution, a plurality of conductive particles, and the solvent. The present disclosure further includes a method of manufacturing the EMI shielding film.

15 Claims, 2 Drawing Sheets

EMI SHIELDING FILM AND METHOD OF MANUFACTURING THE SAME

BACKGROUND

Technical Field

The present disclosure relates to an EMI shielding film and a method of manufacturing the same, and more particularly to an EMI shielding film that can take into account adhesion strength and electrical reliability and a method of manufacturing the same.

Description of Related Art

The statements in this section merely provide background information related to the present disclosure and do not necessarily constitute prior art.

With development of electronic products and trend toward miniaturization of electronic products, flexible printed circuit boards have become more and more important. Especially for office machines, communication machines and mobile electronic products, the electromagnetic interference (EMI) problem that needs to be dealt with for multi-function, high-performance, and miniaturization is more important. Therefore, many flexible printed circuit boards are generally designed with EMI shielding film to shield EMI. Since the EMI shielding film in prior art must be able to be pasted on an irregular surface composed of various types of mechanisms or components, the metal content in the EMI shielding film must be restricted. However, such a limitation of metal content will affect that EMI shielding ability and thermal conductivity of the EMI shielding film cannot be improved, even adhesion strength, heat resistance, and electrical reliability cannot be taken into account at the same time.

Therefore, how to design an EMI shielding film and a method of manufacturing the same, in particular to solve the aforementioned technical problems of the prior art, is an important subject studied by the inventor of the present disclosure.

SUMMARY

One purpose of the present disclosure is to provide an EMI shielding film, which can solve the problem that EMI shielding ability and thermal conductivity in prior art cannot be improved, and achieve a purpose of adhesion strength, heat resistance, and electrical reliability can be taken into account at the same time.

In order to achieve the purpose as mentioned, the EMI shielding film of the present disclosure includes: a flexible composite metal layer, a transparent insulating layer, and a conductive adhesive layer. The flexible composite metal layer includes at least two metal layers stacked. The transparent insulating layer is disposed on one surface of the flexible composite metal layer. The conductive adhesive layer is disposed on the other surface of the flexible composite metal layer, the conductive adhesive layer is formed by removing a solvent from a conductive adhesive composition. The conductive adhesive composition includes an acrylate solution with 30 to 40 parts by weight, a divalent acid ester solution with 30 to 40 parts by weight, a plurality of conductive particles with 2 to 5 parts by weight, and the solvent. When the acrylate solution is 100 parts by weight, the acrylate solution includes an acrylate with 30 to 40 parts by weight, 50% of the plurality of conductive particles have a particle size of 5 to 10 microns.

Further, the acrylate includes one of methacrylate resin, methyl methacrylate resin, ethyl acrylate resin, methyl ethyl acrylate resin, propyl acrylate resin, propyl methyl acrylate resin, butyl acrylate resin, butyl methyl acrylate resin, or combinations thereof.

Further, each of the plurality of conductive particles includes one of carbon particles, silver particles, copper particles, nickel particles, solder, and silver-coated copper particles, or combinations thereof.

Further, the solvent includes one of toluene, ethyl acetate (EAC), methyl ethyl ketone oxime (MEKO), xylene, acetone, methyl ethyl ketone (MEK), isopropyl alcohol (IPA), butyl acetate (BAC), propylene glycol methyl ether acetate (PMA), or combinations thereof.

Further, the conductive adhesive composition further includes a nano conductive additive with 0.01 to 1 parts by weight, the nano conductive additive includes one of carbon nanotubes, nano silver, organic conductive coatings, and graphene, or combinations thereof.

Further, the conductive adhesive composition further includes an additive with 1 to 5 parts by weight, the additive includes one of a polymerization accelerator, a dispersant, a tackifier, an antioxidant, a pigment, a dye, a plasticizer, an ultraviolet absorber, a defoamer, leveling agent, filler, flame retardant, silicon-oxygen coupling agent, antioxidant, antistatic agent, and viscosity regulator, or combinations thereof.

Another one purpose of the present disclosure is to provide a method of manufacturing an EMI shielding film, which can solve the problem that EMI shielding ability and thermal conductivity in prior art cannot be improved, and achieve a purpose of adhesion strength, heat resistance, and electrical reliability can be taken into account at the same time.

In order to achieve the purpose as mentioned, the method of manufacturing an EMI shielding film of the present disclosure includes steps of: Stacking at least two metal layers into a flexible composite metal layer. Disposing a transparent insulating layer on one surface of the flexible composite metal layer. Disposing a conductive adhesive layer on the other surface of the flexible composite metal layer. The conductive adhesive layer is formed by removing a solvent from a conductive adhesive composition. The conductive adhesive composition includes an acrylate solution with 30 to 40 parts by weight, a divalent acid ester solution with 30 to 40 parts by weight, a plurality of conductive particles with 2 to 5 parts by weight of, and the solvent. When the acrylate solution is 100 parts by weight, the acrylate solution includes an acrylate with 30 to 40 parts by weight, 50% of the plurality of conductive particles have a particle size of 5 to 10 microns.

Further, the method of manufacturing the EMI shielding film further includes a step of: Placing the conductive adhesive composition at room temperature. Stirring the conductive adhesive composition at 60 rpm for eight hours, and then standing the conductive adhesive composition for 60 minutes. Controlling a viscosity of the conductive adhesive composition between 10 cps and 50 cps by adding ethyl acetate or toluene to the conductive adhesive composition.

Further, during the conductive adhesive composition is stirred at 60 rpm for eight hours, an energy is outputted to the conductive adhesive composition to improve uniformity of the conductive adhesive composition.

Further, a process of during disposing the conductive adhesive layer on the other surface of the flexible composite metal layer includes a step of: Placing the conductive adhesive composition at room temperature. Applying the conductive adhesive composition to the flexible composite metal layer, and then heating the conductive adhesive composition in an environment with 140° C. to 150° C. for 4 minutes to 5 minutes to remove the solvent from the conductive adhesive composition, and to form the conductive adhesive layer with a thickness of 3 to 5 microns.

Further, the acrylate includes one of methacrylate resin, methyl methacrylate resin, ethyl acrylate resin, methyl ethyl acrylate resin, propyl acrylate resin, propyl methyl acrylate resin, butyl acrylate resin, butyl methyl acrylate resin, or combinations thereof.

Further, each of the plurality of conductive particles includes one of carbon particles, silver particles, copper particles, nickel particles, solder, and silver-coated copper particles, or combinations thereof.

Further, the solvent includes one of toluene, ethyl acetate (EAC), methyl ethyl ketone oxime (MEKO), xylene, acetone, methyl ethyl ketone (MEK), isopropyl alcohol (IPA), butyl acetate (BAC), propylene glycol methyl ether acetate (PMA), or combinations thereof.

Further, the conductive adhesive composition further includes a nano conductive additive with 0.01 to 1 parts by weight, the nano conductive additive includes one of carbon nanotubes, nano silver, organic conductive coatings, and graphene, or combinations thereof.

Further, the conductive adhesive composition further includes an additive with 1 to 5 parts by weight, the additive includes one of a polymerization accelerator, a dispersant, a tackifier, an antioxidant, a pigment, a dye, a plasticizer, an ultraviolet absorber, a defoamer, leveling agent, filler, flame retardant, silicon-oxygen coupling agent, antioxidant, antistatic agent, and viscosity regulator, or combinations thereof.

When using the EMI shielding film of the present disclosure, the flexible composite metal layer can be adhered to any surface of the electronic component through the conductive adhesive layer. Because the conductive adhesive layer is formed by removing the solvent from the conductive adhesive composition, and the acrylate solution included in the conductive adhesive composition can be taken into account with flexibility, bending resistance and heat resistance. Especially for the application of flexible printed circuit boards, the conductive adhesive layer must have effect of resistance to bending, breakage and heat resistance of components, and can be applied to mechanical structures that require repeated bending. The conductive adhesive layer of the present disclosure has an adhesive force of more than 4 N/cm, and there is no need to worry about adhesive strength. In addition, since 50% of the plurality of conductive particles have a particle size of 5 to 10 microns, flatness and adhesion strength of the conductive adhesive layer to an adhesive surface can be maintained. Because the plurality of conductive particles only occupies 2 to 5 parts by weight in the conductive adhesive composition, it will not significantly change adhesion strength of the acrylate within the conductive adhesive layer. The plurality of conductive particles can also make the conductive adhesive layer has 55 dB shielding ability against 1 GHz EMI.

Therefore, the EMI shielding film and the method of manufacturing the same of the present disclosure can solve the problem that EMI shielding ability and thermal conductivity in prior art cannot be improved, and achieve the purpose of adhesion strength, heat resistance, and electrical reliability can be taken into account at the same time.

In order to further understand the techniques, means, and effects of the present disclosure for achieving the intended purpose. Please refer to the following detailed description and drawings of the present disclosure. The drawings are provided for reference and description only, and are not intended to limit the present disclosure.

DETAILED DESCRIPTION

Figure 1:
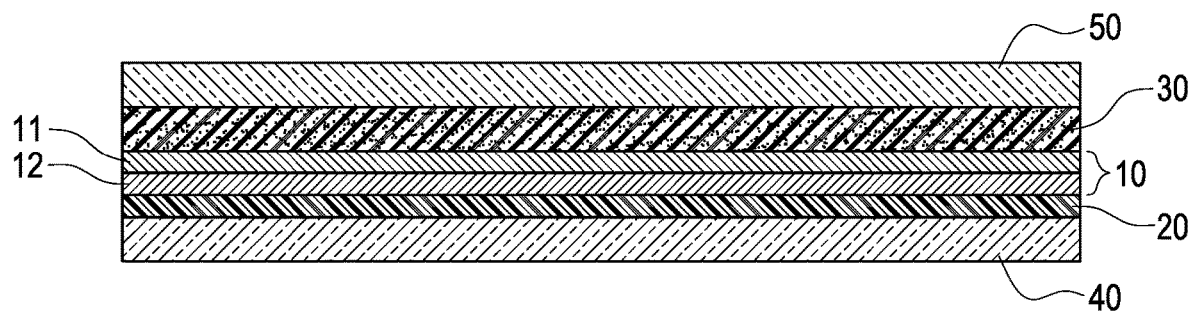
FIG. 1 is a structure schematic diagram of an EMI shielding film of the present disclosure.

The embodiments of the present disclosure are described by way of specific examples, and those skilled in the art can readily appreciate the other advantages and functions of the present disclosure. The present disclosure may be embodied or applied in various other specific embodiments, and various modifications and changes can be made without departing from the spirit and scope of the present disclosure.

It should be understood that the structures, the proportions, the sizes, the number of components, and the like in the drawings are only used to cope with the contents disclosed in the specification for understanding and reading by those skilled in the art, and it is not intended to limit the conditions that can be implemented in the present disclosure, and thus is not technically significant. Any modification of the structure, the change of the proportional relationship, or the adjustment of the size, should be within the scope of the technical contents disclosed by the present disclosure without affecting the effects and the achievable effects of the present disclosure.

The technical content and detailed description of the present disclosure will be described below in conjunction with the drawings.

Figure 2:
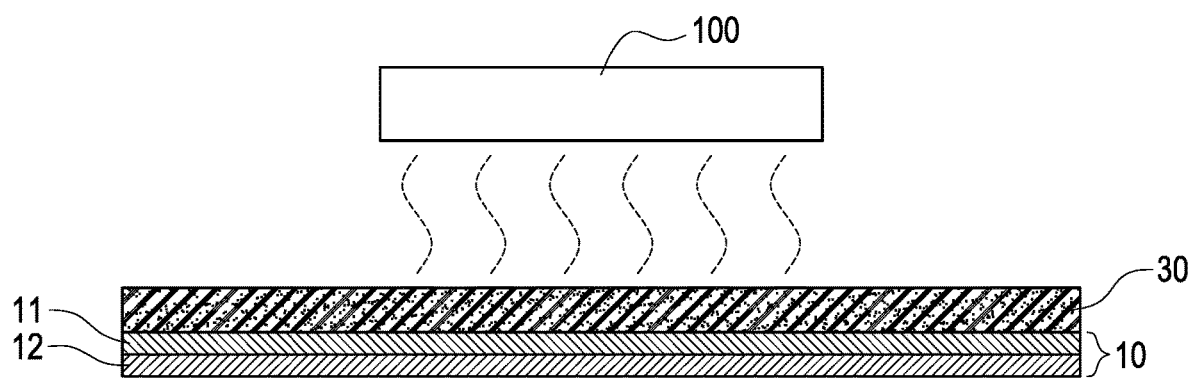
FIG. 2 is a schematic diagram of drying the EMI shielding film of the present disclosure.

Please refer to FIG. 1 and FIG. 2. FIG. 1 is a structure schematic diagram of an EMI shielding film of the present disclosure. FIG. 2 is a schematic diagram of drying the EMI shielding film of the present disclosure.

The EMI shielding film includes a flexible composite metal layer 10, a transparent insulating layer 20, and a conductive adhesive layer 30. The flexible composite metal layer 10 includes at least two metal layers stacked. In an embodiment of the present disclosure, the flexible composite metal layer 10 may be formed by stacking a soft silver metal layer 11 and a soft copper metal layer 12. However, the present disclosure is not limited thereto.

The transparent insulating layer 20 is disposed on one surface of the flexible composite metal layer 10. In the embodiment of the present disclosure, the transparent insulating layer 20 is first disposed on one surface of the flexible composite metal layer 10, and then the conductive adhesive layer 30 is disposed on the other surface of the flexible composite metal layer 10. However, the present disclosure is not limited thereto.

The conductive adhesive layer 30 is disposed on the other surface of the flexible composite metal layer 10. The conductive adhesive layer 30 is formed by removing a solvent (not shown) from a conductive adhesive composition (not shown). The conductive adhesive composition includes an acrylate solution with 30 to 40 parts by weight, a divalent acid ester solution with 30 to 40 parts by weight, a plurality of conductive particles with 2 to 5 parts by weight, and the solvent. When the acrylate solution is 100 parts by weight, the acrylate solution includes an acrylate with 30 to 40 parts by weight. That is, in addition to the solvent, the acrylate solution may include acrylate with 30 wt % to 40 wt %. 50% of the plurality of conductive particles have a particle size of 5 to 10 microns. The conductive adhesive layer 30 can electrically connect the flexible composite metal layer 10 to flexible circuit boards or circuit board components, such as ground wires connected to components). The flexible circuit boards and the circuit board components are adhered by the conductive adhesive layer 30.

Further, the resin composition used to make the conductive adhesive layer 30 can use such as: thermoplastic resin (polystyrene, vinyl acetate, polyester, polyethylene, polypropylene, polyamide, rubber, acrylic, etc.) or thermosetting resin (phenolic, epoxy, urethane, melamine, alkyd, etc.). The acrylate can have both bending resistance and heat resistance, especially for flexible printed circuit boards, which is more reliable for use conditions that require repeated bending.

The acrylate described in the embodiments of the present disclosure refers to a resin containing an acrylate compound or an acrylate polymer. The acrylate is ester derived from acrylic acid. The acrylic acid generally contains unsaturated carboxylic acid of vinyl group and carboxyl group. The acrylate used in the present disclosure includes one of methacrylate resin, methyl methacrylate resin, ethyl acrylate resin, methyl ethyl acrylate resin, propyl acrylate resin, propyl methyl acrylate resin, butyl acrylate resin, butyl methyl acrylate resin, or combinations thereof. In some embodiments of the present disclosure, the acrylate may be methacrylate resin or methyl methacrylate resin.

The solvent in the acrylate solution or the solvent of the conductive adhesive composition as described above may include one of toluene, ethyl acetate (EAC), methyl ethyl ketone oxime (MEKO), xylene, acetone, methyl ethyl ketone (MEK), isopropyl alcohol (IPA), butyl acetate (BAC), propylene glycol methyl ether acetate (PMA), or combinations thereof. In the embodiment of the present disclosure, the solvent in the acrylate solution may be EAC, and the solvent of the conductive adhesive composition may be toluene. However, the present disclosure is not limited thereto. The solvent of the conductive adhesive composition can be adjusted so that total weight is close to 100 parts by weight. Or, if necessary, increasing or decreasing the solvent of the conductive adhesive composition. So that the conductive adhesive composition has a suitable viscosity during coating.

Further, each of the plurality of conductive particles may include one of carbon particles, silver particles, copper particles, nickel particles, solder, and silver-coated copper particles, or combinations thereof. The silver-coated copper particles are completed by applying silver plating to copper powder. In an embodiment of the present disclosure, nickel particles may be used as conductive particles, and at least 50% of the plurality of conductive particles have a particle size of 5 to 10 microns. In the embodiment of the present disclosure, the conductive adhesive composition further includes a nano conductive additive with 0.01 to 1 parts by weight, and an additive with 1 to 5 parts by weight. The nano conductive additive includes one of carbon nanotubes, nano silver, organic conductive coatings, and graphene, or combinations thereof. The organic conductive coating may be: poly(3,4-ethylenedioxythiophene) polystyrene sulfonate (PEDOT:PSS). The additive includes one of a polymerization accelerator, a dispersant, a tackifier, an antioxidant, a pigment, a dye, a plasticizer, an ultraviolet absorber, a defoamer, leveling agent, filler, flame retardant, silicon-oxygen coupling agent, antioxidant, antistatic agent, and viscosity regulator, or combinations thereof. The polymerization accelerator can be used to control an adhesion time of the conductive adhesive layer 30, and be used to improve adhesion effect of the conductive adhesive layer 30.

In the actual final product, an outside of the transparent insulating layer 20 is covered with a first release film 40 to protect the transparent insulating layer 20, and an outside of the conductive adhesive layer 30 is covered with a second release film 50 to protect the conductive adhesive layer 30.

The conductive adhesive layer 30 is formed by removing the solvent from the conductive adhesive composition. In the embodiment of the present disclosure, as shown in FIG. 2, the conductive adhesive composition coated on the flexible composite metal layer 10 can be heated by a heating unit 100. And then the conductive adhesive composition is heated in an environment with 140° C. to 150° C. for 4 minutes to 5 minutes to remove the solvent from the conductive adhesive composition, and to form the conductive adhesive layer 30 with a thickness of 3 to 5 microns.

Figure 3:
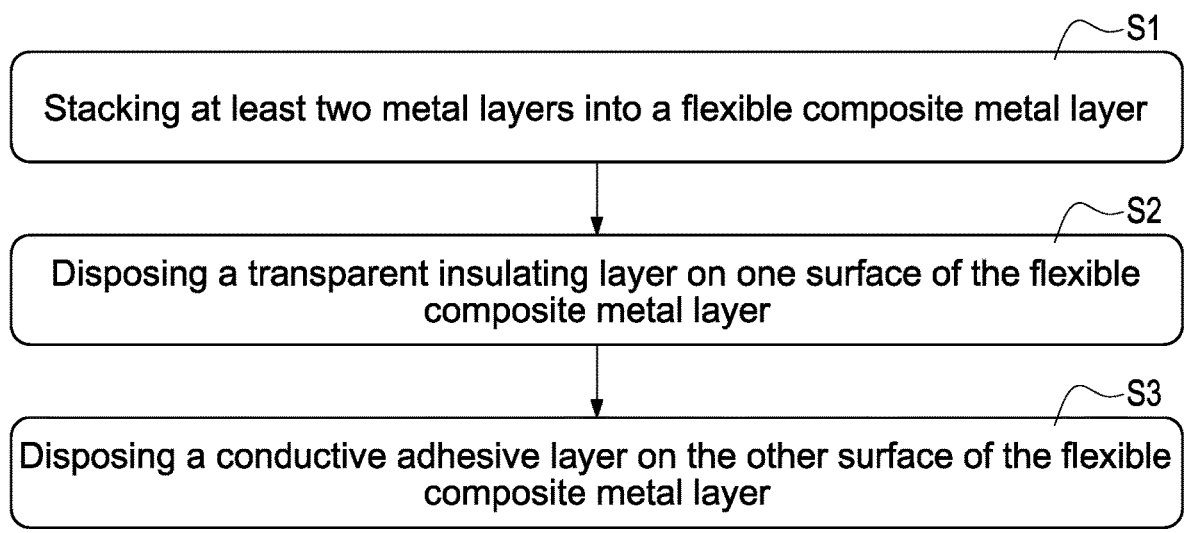
FIG. 3 and FIG. 4 are flowcharts of a method of manufacturing the EMI shielding film of the present disclosure.
Figure 4:
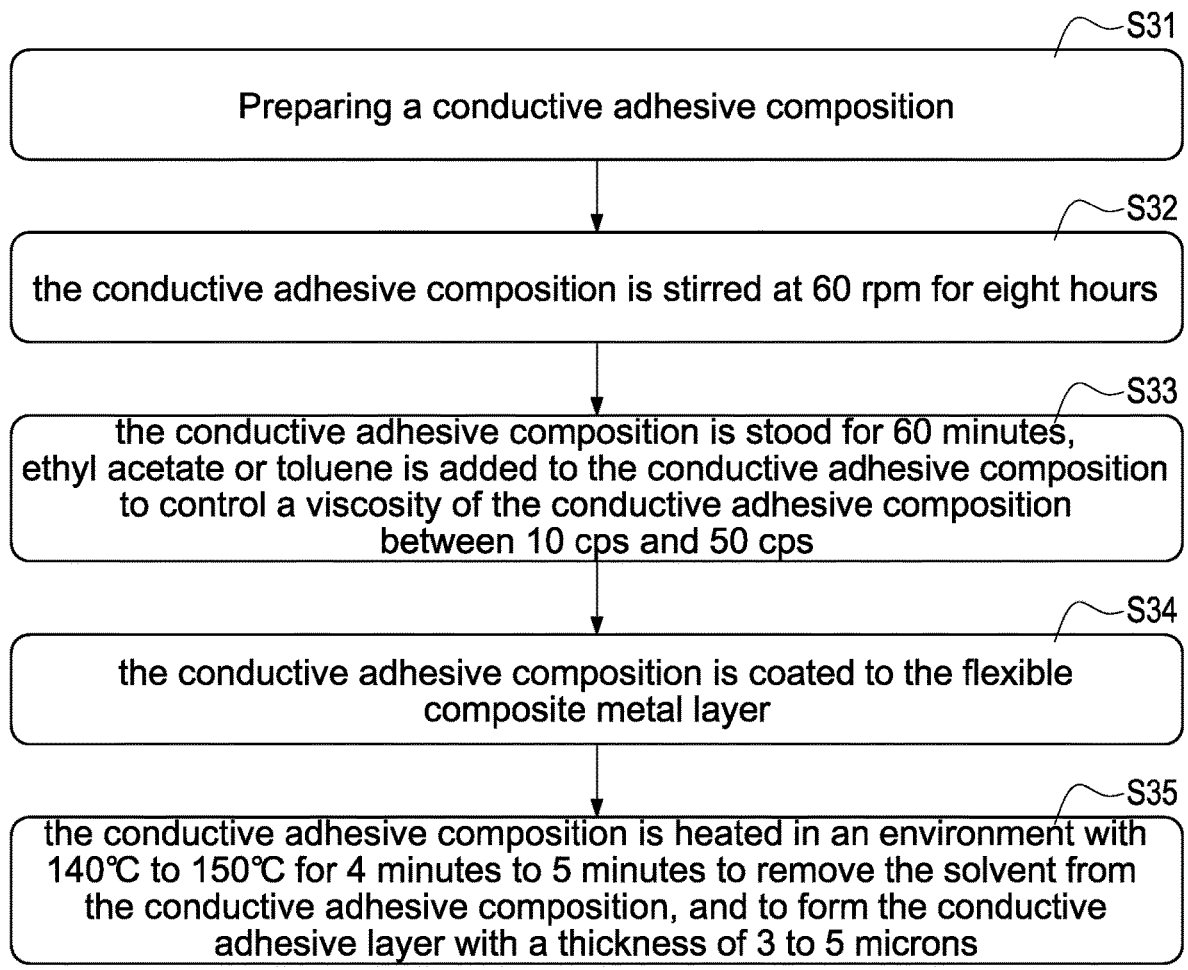

Please refer to FIG. 3 and FIG. 4. FIG. 3 and FIG. 4 are flowcharts of a method of manufacturing the EMI shielding film of the present disclosure. Please refer to FIG. 1 for the corresponding reference signs.

A method of manufacturing the EMI shielding film of the present disclosure includes steps of: Stacking at least two metal layers into a flexible composite metal layer 10 (step S1). Disposing a transparent insulating layer 20 on one surface of the flexible composite metal layer 10 (step S2). Disposing a conductive adhesive layer 30 on the other surface of the flexible composite metal layer 10 (step S3).

In the embodiment of the present disclosure, the method of manufacturing of the EMI shielding film further includes: Preparing a conductive adhesive composition (step S31). The conductive adhesive composition may include an acrylate solution with 30 to 40 parts by weight, a divalent acid ester solution with 30 to 40 parts by weight, a plurality of conductive particles with 2 to 5 parts by weight of, a nano conductive additive with 0.01 to 1 parts by weight, an additive with 1 to 5 parts by weight, and the solvent. When the acrylate solution is 100 parts by weight, the acrylate solution includes an acrylate with 30 to 40 parts by weight, 50% of the plurality of conductive particles have a particle size of 5 to 10 microns.

Afterward, the conductive adhesive composition is placed at room temperature (for example, 25° C.), and the conductive adhesive composition is stirred at 60 rpm for eight hours (step S32). And then, the conductive adhesive composition is stood for 60 minutes, ethyl acetate or toluene is added to the conductive adhesive composition to control a viscosity of the conductive adhesive composition between 10 cps and 50 cps (step S33). During the stir (at 60 rpm for eight hours) of the conductive adhesive composition, an energy output unit (not shown) can output energy to the conductive adhesive composition to improve uniformity of the conductive adhesive composition. The energy output unit may include thermal energy (such as water bath, oil bath, electric heater, heat exchange tube), radiant energy (such as ultraviolet light irradiation, y ray irradiation), or combinations thereof. The energy output unit may be used to increase reaction energy of the conductive adhesive composition to increase temperature of the conductive adhesive composition by the energy output unit, thereby improving uniformity of heat transfer and reaction. For example, the conductive adhesive composition can be heated and stirred at the same time.

Finally, the conductive adhesive composition is placed at room temperature (for example, 25° C.), and the conductive adhesive composition is coated (for example, with Die Coater method) to the flexible composite metal layer 10 (step S34). And then, the conductive adhesive composition is heated in an environment with 140° C. to 150° C. for 4 minutes to 5 minutes to remove the solvent from the conductive adhesive composition, and to form the conductive adhesive layer 30 with a thickness of 3 to 5 microns (step S35).

When the EMI shielding film of the present disclosure is used, the flexible composite metal layer 10 can be adhered to any surface of the electronic component through the conductive adhesive layer 30. Because the conductive adhesive layer 30 is formed by removing the solvent from the conductive adhesive composition, the acrylate solution included in the conductive adhesive composition can be taken into account with flexibility, bending resistance and heat resistance. Especially for the application of flexible printed circuit boards, the conductive adhesive layer 30 must have effect of resistance to bending, breakage and heat resistance of components, and can be applied to mechanical structures that require repeated bending. The conductive adhesive layer 30 has an adhesive force of more than 4 N/cm, and there is no need to worry about adhesive strength. In addition, since 50% of the plurality of conductive particles have a particle size of 5 to 10 microns, flatness and adhesion strength of the conductive adhesive layer 30 to an adhesive surface can be maintained. Because the plurality of conductive particles only occupies 2 to 5 parts by weight in the conductive adhesive composition, it will not significantly change adhesion strength of the acrylate within the conductive adhesive layer 30. The plurality of conductive particles can also make the conductive adhesive layer 30 have 55 dB shielding ability against 1 GHz EMI.

Therefore, the EMI shielding film and the method of manufacturing the same of the present disclosure can solve the problem that EMI shielding ability and thermal conductivity in prior art cannot be improved, and achieve the purpose of adhesion strength, heat resistance, and electrical reliability can be taken into account at the same time.

The following may be many embodiments of the present disclosure:

Example 1

First prepare acrylate solution. Mixing 12.5 g of polyalkyl acrylate compound and 22.5 g of ethyl acetate (EAC) in a three-port glass reactor (300 ml) at room temperature. After stirring evenly with a stirrer with 2 impellers for two hours, adding 35 g of dibasic acid ester solution, 25 g of solvent (toluene), and 3 g of nickel particle powder (50% or more with a particle size of 5um to 10 um), 2 parts by weight of dispersant, and 0.5 g of PEDOT:PSS with concentration 1% to 2.5%. Continuing stirring at room temperature for eight hours and then standing for one hour. And then, adding EAC or toluene to control a viscosity of the conductive adhesive composition between 30 cps and 50 cps. The ingredients are shown in Table 1. After completing the foregoing steps, a resin composition of the conductive adhesive composition is coated on the flexible composite metal layer 10 with the Die Coater method at room temperature, and dried by heating after coating. A heating condition is that the conductive adhesive composition is heated in an environment with 140° C. to 150° C. for 4 minutes to 5 minutes to remove the solvent from the conductive adhesive composition, and to form the conductive adhesive layer 30 with a thickness of 3 to 5 microns.

Example 2

A resin composition 2 of the conductive adhesive composition is prepared in the same manner as in Example 1, except that the polyalkyl acrylate compound in the acrylate solution is adjusted to 10 g, and the EAC is adjusted to 25 g, as shown in Table 1.

Example 3

A resin composition 3 of the conductive adhesive composition is prepared in the same manner as in Example 1, except that the polyalkyl acrylate compound in the acrylate solution is adjusted to 14 g, and the EAC is adjusted to 21 g, as shown in Table 1.

Example 4

A resin composition 4 of the conductive adhesive composition is prepared in the same manner as in Example 1, except that the acrylate solution is adjusted to 30 g, and the dibasic acid ester solution is adjusted to 40 g, as shown in Table 1.

Example 5

A resin composition 5 of the conductive adhesive composition is prepared in the same manner as in Example 1, except that the acrylate solution is adjusted to 40 g, and the dibasic acid ester solution is adjusted to 30 g, as shown in Table 1.

Example 6

A resin composition 6 of the conductive adhesive composition is prepared in the same manner as in Example 1, except that PEDOT:PSS is replaced with 0.05 g of carbon nanotubes, as shown in Table 1.

Comparative Example 1

A resin composition 1' of the conductive adhesive composition is prepared in the same manner as in Example 1, except that the polyalkyl acrylate compound in the acrylate solution is adjusted to 7 g, and the EAC is adjusted to 28 g, as shown in Table 1.

Comparative Example 2

A resin composition 2' of the conductive adhesive composition is prepared in the same manner as in Example 1, except that the polyalkyl acrylate compound in the acrylate solution is adjusted to 17.5 g, and the EAC is adjusted to 17.5 g, as shown in Table 1.

Comparative Example 3

A resin composition 3' of the conductive adhesive composition is prepared in the same manner as in Example 1, except that the acrylate solution is adjusted to 20 g, and the dibasic acid ester solution is adjusted to 50 g, as shown in Table 1.

Comparative Example 4

A resin composition 4' of the conductive adhesive composition is prepared in the same manner as in Example 1, except that the acrylate solution is adjusted to 50 g, and the dibasic acid ester solution is adjusted to 20 g, as shown in Table 1.

Comparative Example 5

A resin composition 5' of the conductive adhesive composition is prepared in the same manner as in Example 1, except that the original nickel particles are replaced with 80% of nickel particles having a particle size of 1 to 4 microns, as shown in Table 1.

Comparative Example 6

A resin composition 6' of the conductive adhesive composition is prepared in the same manner as in Example 1, except that PEDOT:PSS or carbon nanotubes are not added, as shown in Table 1.

As shown in Table 1 above, Examples 1 to 5 of the present disclosure reveal that they have good film forming properties, heat resistance, and adhesive force that can reach more than 4 N/cm. The appearance of the actual final product can also be kept flat without bubbles or unevenness. The moisture absorption performance can still be maintained below 0.5%, and the amount of residual glue on the surface of the attached article is low. The necessary conductive additives, such as PEDOT:PSS or carbon nanotubes, are added to the composition of Examples 1 to 6 of the present disclosure, so that the EMI shielding film of the present disclosure has 55 dB shielding ability against 1 GHz EMI.

In addition, the resin compositions 1 and 3 listed in Table 1 have fewer polyalkyl acrylates than others, which have poor film forming properties, insufficient heat resistance, poor surface molding, and insufficient adhesion. The resin compositions 2 and 4 use more polyalkyl acrylates than others, forming surface of the actual finished product is uneven, and residual glue is serious. Because the thickness of the resin compositions 2 or 4 is more than 5 microns, conductive nickel particles have fewer contact points

TABLE 1

| | unit | \multicolumn{6}{c|}{Resin composition number} | | | | | | |
|---|---|---|---|---|---|---|---|---|---|---|---|---|---|
| | | 1 | 2 | 3 | 4 | 5 | 6 | 1' | 2' | 3' | 4' | 5' | 6' |
| polyalkyl acrylate compound | g | 12.5 | 10 | 14 | 10.5 | 14 | 12.5 | 7 | 17.5 | 7 | 17.5 | 12.5 | 12.5 |
| EAC | g | 22.5 | 25 | 21 | 19.5 | 26 | 22.5 | 28 | 17.5 | 14 | 32.5 | 22.5 | 22.5 |
| dibasic acid ester solution | g | 35 | 35 | 35 | 40 | 30 | 35 | 35 | 35 | 50 | 20 | 35 | 35 |
| nickel particles 50% 5~10 um | g | 3 | 3 | 3 | 3 | 3 | 3 | 3 | 3 | 3 | 3 | 0 | 3 |
| nickel particles 80% 1~4 um | g | 0 | 0 | 0 | 0 | 0 | 0 | 0 | 0 | 0 | 0 | 3 | 0 |
| Dispersant | g | 2 | 2 | 2 | 2 | 2 | 2 | 2 | 2 | 2 | 2 | 2 | 2 |
| PEDOT:PSS | g | 0.5 | 0.5 | 0.5 | 0.5 | 0.5 | 0 | 0.5 | 0.5 | 0.5 | 0.5 | 0.5 | 0 |
| carbon nanotubes | g | 0 | 0 | 0 | 0 | 0 | 0.05 | 0 | 0 | 0 | 0 | 0 | 0 |
| toluene | g | 25 | 25 | 25 | 25 | 25 | 25 | 27 | 25 | 25 | 25 | 25 | 25 |
| viscosity | cps | 40 | 38 | 41 | 38 | 41 | 40 | 30 | 55 | 52 | 35 | 41 | N/A |
| Final product inspection items (conductive adhesive layer) | N/A | 1 | 2 | 3 | 4 | 5 | 6 | 1' | 2' | 3' | 4' | 5' | 6' |
| thickness | μm | 3.8 | 3.6 | 4 | 3.6 | 4.1 | 3.8 | 2.5 | 5.8 | 2.6 | 6.5 | 3.8 | 3.8 |
| Heat resistance (200° C., 60 minutes) | | OK | OK | OK | OK | OK | OK | NG | OK | NG | OK | OK | OK |
| Peeling test  PP FR4 | N/cm | 5 | 4 | 5 | 4 | 5 | 5 | 2 | 6 | 3 | 6 | 5 | 5 |
| copper foil (Shiny side) | N/cm | 4 | 4 | 4 | 4 | 4 | 4 | 3 | 5 | 3 | 5 | 4 | 4 |
| Appearance (concave and convex points, water marks) | N/A | OK | OK | OK | OK | OK | OK | Bubbles | Uneven | Bubbles | Uneven | OK | OK |
| Moisture absorption rate 40° C., 90% RH 96 hr | % | 0.44 | 0.45 | 0.41 | 0.44 | 0.42 | 0.45 | 0.42 | 0.38 | 0.44 | 0.35 | 0.44 | 0.44 |
| Heat shrink 170° C./1 hr | % | 0.1 | 0.1 | 0.1 | 0.1 | 0.1 | 0.1 | 0.1 | 0.1 | 0.1 | 0.1 | 0.1 | 0.1 |
| Residual glue analysis | point | 5 | 3 | 5 | 3 | 6 | 4 | 2 | >10, serious | 5 | >10, serious | 4 | 5 |
| Shielding Effectiveness ASTM 4935 | GHz | >55 | >55 | >55 | >55 | >55 | >55 | >55 | 30 | >55 | 30 | 30 | 50 |

Note: Supplementary instructions for final product inspection items:

[Peeling Test]

The conductive adhesive layer 30 formed as an EMI shielding film is attached to PP or copper foil, and then the EMI shielding film is peeled from the PP or copper foil, and tensile force of the conductive adhesive layer 30 (in N/cm) is measured.

[Residual Glue Analysis]

The EMI shielding film attaches to the copper foil. After the EMI shielding film stands for 24 hours in an environment with 85° C. and humidity 85%, the copper foil is peeled off form the EMI shielding film. Use an optical microscope to detect residual glue within a unit surface has 10 cm2 in any five positions within the copper foil with A4 size.

between attached copper foil and ground wire, shielding ability against 1 GHz EMI can only reach 40 dB. The resin composition 5 further verifies that if a smaller particle composition such as 80% of the nickel particles with a particle size of 1 to 4 microns is used, the shielding ability against 1 GHz EMI can only reach 30 dB. The resin composition 6 reveals that if auxiliary conductive additives such as PEDOT:PSS or carbon nanotubes are not added to solvent composition, the shielding ability against 1 GHz EMI can only reach 50 dB.

The EMI shielding film of the present disclosure is tested in an environment of 85° C. and humidity of 85%, and the EMI shielding film can still maintain a certain resistance value so that shielding function does not fail. In addition, the double-layer structure of the flexible composite metal layer 10 can effectively improve the conductivity and the reliability of EMI shielding.

The above is only a detailed description and drawings of the preferred embodiments of the present disclosure, but the features of the present disclosure are not limited thereto, and are not intended to limit the present disclosure. All the scope of the present disclosure shall be subject to the scope of the following claims. The embodiments of the spirit of the present disclosure and its similar variations are intended to be included in the scope of the present disclosure. Any variation or modification that can be easily conceived by those skilled in the art in the field of the present disclosure can be covered by the following claims.

What is claimed is:

1. An EMI shielding film comprising:
    a flexible composite metal layer comprising at least two metal layers stacked,
    a transparent insulating layer disposed on one surface of the flexible composite metal layer, and
    a conductive adhesive layer disposed on the other surface of the flexible composite metal layer, the conductive adhesive layer formed by removing a solvent from a conductive adhesive composition, the conductive adhesive composition comprising an acrylate solution with 30 to 40 parts by weight, a divalent acid ester solution with 30 to 40 parts by weight, a plurality of conductive particles with 2 to 5 parts by weight, and the solvent,
    wherein, when the acrylate solution is 100 parts by weight, the acrylate solution comprises an acrylate with 30 to 40 parts by weight, 50% of the plurality of conductive particles have a particle size of 5 to 10 microns.

2. The EMI shielding film in claim 1, wherein the acrylate comprises one of methacrylate resin, methyl methacrylate resin, ethyl acrylate resin, methyl ethyl acrylate resin, propyl acrylate resin, propyl methyl acrylate resin, butyl acrylate resin, butyl methyl acrylate resin, or combinations thereof.

3. The EMI shielding film in claim 1, wherein each of the plurality of conductive particles comprises one of carbon particles, silver particles, copper particles, nickel particles, solder, and silver-coated copper particles, or combinations thereof.

4. The EMI shielding film in claim 1, wherein the solvent comprises one of toluene, ethyl acetate, methyl ethyl ketone oxime, xylene, acetone, methyl ethyl ketone, isopropyl alcohol, butyl acetate, propylene glycol methyl ether acetate, or combinations thereof.

5. The EMI shielding film in claim 1, wherein the conductive adhesive composition further comprises a nano conductive additive with 0.01 to 1 parts by weight, the nano conductive additive comprises one of carbon nanotubes, nano silver, organic conductive coatings, and graphene, or combinations thereof.

6. The EMI shielding film in claim 1, wherein the conductive adhesive composition further comprises an additive with 1 to 5 parts by weight, the additive comprises one of a polymerization accelerator, a dispersant, a tackifier, an antioxidant, a pigment, a dye, a plasticizer, an ultraviolet absorber, a defoamer, leveling agent, filler, flame retardant, silicon-oxygen coupling agent, antioxidant, antistatic agent, and viscosity regulator, or combinations thereof.

7. A method of manufacturing an EMI shielding film, the method comprising steps of:
    stacking at least two metal layers into a flexible composite metal layer,
    disposing a transparent insulating layer on one surface of the flexible composite metal layer, and
    disposing a conductive adhesive layer on the other surface of the flexible composite metal layer,
    wherein, the conductive adhesive layer is formed by removing a solvent from a conductive adhesive composition, the conductive adhesive composition comprises an acrylate solution with 30 to 40 parts by weight, a divalent acid ester solution with 30 to 40 parts by weight, a plurality of conductive particles with 2 to 5 parts by weight of, and the solvent,
    wherein, when the acrylate solution is 100 parts by weight, the acrylate solution comprises an acrylate with 30 to 40 parts by weight, 50% of the plurality of conductive particles have a particle size of 5 to 10 microns.

8. The method of manufacturing the EMI shielding film in claim 7, further comprising a step of:
    placing the conductive adhesive composition at room temperature, stirring the conductive adhesive composition at 60 rpm for eight hours, and then standing the conductive adhesive composition for 60 minutes, controlling a viscosity of the conductive adhesive composition between 10 cps and 50 cps by adding ethyl acetate or toluene to the conductive adhesive composition.

9. The method of manufacturing the EMI shielding film in claim 8, wherein during the stir of the conductive adhesive composition, an energy is outputted to the conductive adhesive composition to improve uniformity of the conductive adhesive composition.

10. The method of manufacturing the EMI shielding film in claim 7, wherein a process of during disposing the conductive adhesive layer on the other surface of the flexible composite metal layer comprises a step of:
    placing the conductive adhesive composition at room temperature, applying the conductive adhesive composition to the flexible composite metal layer, and then heating the conductive adhesive composition in an environment with 140° C. to 150° C. for 4 minutes to 5 minutes to remove the solvent from the conductive adhesive composition, and to form the conductive adhesive layer with a thickness of 3 to 5 microns.

11. The method of manufacturing the EMI shielding film in claim 7, wherein the acrylate comprises one of methacrylate resin, methyl methacrylate resin, ethyl acrylate resin, methyl ethyl acrylate resin, propyl acrylate resin, propyl methyl acrylate resin, butyl acrylate resin, butyl methyl acrylate resin, or combinations thereof.

12. The method of manufacturing the EMI shielding film in claim 7, wherein each of the plurality of conductive particles comprises one of carbon particles, silver particles, copper particles, nickel particles, solder, and silver-coated copper particles, or combinations thereof.

13. The method of manufacturing the EMI shielding film in claim 7, wherein the solvent comprises one of toluene, ethyl acetate, methyl ethyl ketone oxime, xylene, acetone, methyl ethyl ketone, isopropyl alcohol, butyl acetate, propylene glycol methyl ether acetate, or combinations thereof.

14. The method of manufacturing the EMI shielding film in claim 7, wherein the conductive adhesive composition further comprises a nano conductive additive with 0.01 to 1 parts by weight, the nano conductive additive comprises one of carbon nanotubes, nano silver, organic conductive coatings, and graphene, or combinations thereof.

15. The method of manufacturing the EMI shielding film in claim 7, wherein the conductive adhesive composition further comprises an additive with 1 to 5 parts by weight, the additive comprises one of a polymerization accelerator, a dispersant, a tackifier, an antioxidant, a pigment, a dye, a plasticizer, an ultraviolet absorber, a defoamer, leveling agent, filler, flame retardant, silicon-oxygen coupling agent, antioxidant, antistatic agent, and viscosity regulator, or combinations thereof.

\* \* \* \* \*